(12) United States Patent
Schaaf et al.

(10) Patent No.: US 8,020,288 B2
(45) Date of Patent: Sep. 20, 2011

(54) METHOD FOR PRODUCING AN ELECTRONIC SUBASSEMBLY

(75) Inventors: Ulrich Schaaf, Kaisersbach (DE); Andreas Kugler, Alfdorf (DE); Karl-Friederich Becker, Berlin (DE); Alexander Neumann, Rottweil (DE); Jan Kostelnik, Kirchberg an der Jagst (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/450,998

(22) PCT Filed: Apr. 28, 2008

(86) PCT No.: PCT/EP2008/055175
§ 371 (c)(1),
(2), (4) Date: Mar. 18, 2010

(87) PCT Pub. No.: WO2008/141898
PCT Pub. Date: Nov. 27, 2008

(65) Prior Publication Data
US 2010/0170085 A1 Jul. 8, 2010

(30) Foreign Application Priority Data
May 24, 2007 (DE) .......................... 10 2007 024 189

(51) Int. Cl.
*H05K 7/00* (2006.01)
*H05K 3/00* (2006.01)

(52) U.S. Cl. .......................................... 29/834; 29/837

(58) Field of Classification Search ............ 29/825–856; 438/106–127
See application file for complete search history.

(56) References Cited

U.S. PATENT DOCUMENTS

| 5,344,795 | A | * | 9/1994 | Hashemi et al. | 264/272.15 |
| 6,038,133 | A | * | 3/2000 | Nakatani et al. | 361/760 |
| 6,512,182 | B2 | | 1/2003 | Takeuchi et al. | |
| 6,680,441 | B2 | * | 1/2004 | Kondo et al. | 174/260 |
| 6,759,270 | B2 | * | 7/2004 | Infantolino et al. | 438/106 |
| 6,784,530 | B2 | * | 8/2004 | Sugaya et al. | 257/686 |
| 6,846,700 | B2 | * | 1/2005 | Smith | 438/108 |
| 6,948,944 | B2 | * | 9/2005 | Ueno | 439/68 |
| 6,955,948 | B2 | * | 10/2005 | Asahi et al. | 438/125 |
| 7,294,529 | B2 | * | 11/2007 | Tuominen | 438/107 |
| 7,297,876 | B2 | * | 11/2007 | Sakurai et al. | 174/260 |
| 7,312,405 | B2 | * | 12/2007 | Hsu | 174/262 |
| 7,485,489 | B2 | * | 2/2009 | Bjorbell | 438/106 |
| 7,694,415 | B2 | * | 4/2010 | Honjo et al. | 29/841 |
| 2002/0117743 | A1 | | 8/2002 | Nakatani et al. | |
| 2003/0169575 | A1 | | 9/2003 | Ikuta et al. | |

(Continued)

FOREIGN PATENT DOCUMENTS

DE    10 2005 003 125    7/2006

(Continued)

*Primary Examiner* — Derris H Banks
*Assistant Examiner* — Kaying Kue
(74) *Attorney, Agent, or Firm* — Kenyon & Kenyon LLP (57) ABSTRACT

In a method for producing an electronic subassembly, at least one electronic component is fixed in place on an insulating layer of a conductive foil in a first step, the conductive foil with the electronic component is laminated onto a circuit board substrate, and a circuit track structure is then developed by structuring the conductive foil. The expansion coefficient of the insulating layer lies between the expansion coefficient of the circuit board substrate and the expansion coefficient of the circuit track structure, and/or electronic components that require small passages for contacting with the circuit track structure are pressed deeper into the insulating layer than electronic components that require larger passages in the insulating layer.

15 Claims, 5 Drawing Sheets

U.S. PATENT DOCUMENTS

| | | |
|---|---|---|
| 2004/0001324 A1 | 1/2004 | Ho et al. |
| 2006/0170098 A1 | 8/2006 | Hsu |
| 2006/0194018 A1* | 8/2006 | Ohno et al. .................. 428/116 |
| 2008/0061115 A1* | 3/2008 | Ostmann et al. .............. 228/116 |
| 2010/0328913 A1* | 12/2010 | Kugler et al. ................. 361/761 |
| 2011/0088936 A1* | 4/2011 | Schaaf et al. ................. 174/260 |

FOREIGN PATENT DOCUMENTS

| | | |
|---|---|---|
| EP | 1 729 552 | 12/2006 |
| WO | WO 2005/008733 | 1/2005 |
| WO | WO 2006/056643 | 6/2006 |

* cited by examiner

METHOD FOR PRODUCING AN ELECTRONIC SUBASSEMBLY

BACKGROUND OF THE INVENTION

1. Field of the Invention

The present invention relates to a method for producing an electronic subassembly on a circuit board.

2. Description of Related Art

To permit the encapsulation of electronic components used in electronic subassemblies on circuit boards and to increase the space utilization on the electronic circuit board, it is known to accommodate the electronic components within the circuit board. This provides protection for the electronic components. From U.S. Pat. No. 6,512,182, for example, it is known to cut receptacles into a circuit board substrate, into which the electronic components are then placed. Once the electronic components have been inserted, the receptacles are filled, then smoothed and laminated over. The embedding of the electronic components makes it possible to achieve a flat surface of the electronic subassembly.

One disadvantage of this subassembly is that receptacles into which the electronic components are placed are initially cut into the circuit board substrate. This makes precise positioning of the electronic components quite difficult.

From published German patent document DE 10 2005 003 125, a method for producing an electric circuit is known; the circuit has electric components, which are mechanically interconnected through a casting compound. Provided on at least one side of the casting compound is at least one layer of circuit tracks, which electrically connects the components to each other. To produce the circuit, the components are mounted on a carrier foil and then encapsulated using a casting compound. The carrier foil is then removed, and on the side on which the components were joined to the carrier foil, one or more layers of circuit tracks are affixed, which electrically connect the components to each other.

One disadvantage of this method is that the carrier foil must be removed completely in order to obtain a functioning interconnection of the electric circuit.

BRIEF SUMMARY OF THE INVENTION

The method of the present invention for producing an electronic subassembly, including at least one electronic component, encompasses the following steps:

(a) Mounting the at least one electronic component on the insulating layer of the conductive carrier foil, the active side of the component pointing in the direction of the foil;

(b) Laminating the conductive carrier foil having the at least one electronic component mounted thereon onto a circuit board substrate, the at least one electronic component pointing in the direction of the circuit board substrate;

(c) Forming circuit tracks by structuring the conductive carrier foil, and connecting the at least one electronic component.

In a first example development according to the present invention, the insulating layer of the conductive foil is made of a material whose expansion coefficient lies between the expansion coefficient of the circuit board substrate and the expansion coefficient of the circuit track structure.

In a second example embodiment, electronic components that require small passages in the insulating layer for the contacting with the circuit track structure are pressed deeper into the insulating layer than the electronic components that require larger passages in the insulating layer for the contacting.

In a third example development, the circuit track structure formed in step (c) is spread open prior to the affixation of an additional circuit track structure.

The advantage of the example embodiment in which the insulating layer of the conductive foil is made from a material whose expansion coefficient lies between the expansion coefficient of the circuit track substrate and the expansion coefficient of the circuit track structure is that this reduces stresses between the circuit track structure and the electronic components. The risk of damage to the electronic subassembly, for instance by temperature fluctuations, is reduced.

The advantage of pressing the electronic components that require smaller passages in the insulating layer for the contacting deeper into the insulating layer than electronic components that require larger passages in the insulating layer is that the optimal aspect ratio for the passages, i.e., the ratio of length to diameter of the passages, is able to be adjusted. Even sensitive electronic components such as required in high-frequency technology, for example, are thereby able to be integrated into the electronic subassembly in such a way that a reliable and fault-free operation is possible.

The advantage of spreading open the circuit track structure formed in step (c) prior to mounting an additional circuit track structure is that it simplifies the contacting of the additional layers. Only one highly precise structuring process is required, i.e., that for the first circuit track structure. The additional circuit track structures may be produced by less precise methods known to one skilled in the art. This reduces the production expense of the electronic subassembly.

By affixing the at least one electronic component on the insulating layer of the conductive carrier foil, the electronic components are able to be positioned precisely. When subsequently laminating the conductive carrier foil with the at least one electronic component affixed thereon onto a printed circuit board, the at least one electronic component pointing in the direction of the printed circuit board, the at least one electronic component is enclosed by the printed circuit board. This completely encapsulates the component.

In one example embodiment, the at least one electronic component is enclosed by a polymer mass after being fixed in place on the conductive carrier foil. Enclosing the at least one electronic component by the polymer mass provides additional protection of the component. The risk of damage is considerably reduced in this way, even for sensitive components.

The polymer mass by which the at least one electronic component is enclosed has a liquid resin matrix, for instance. This is cast around the electronic component and then cured. The polymer mass applied in this manner is an epoxy resin, for example.

As an alternative, the polymer mass by which the at least one electronic component is enclosed, may also be a low-pressure compression molding mass such as an epoxy low-pressure compression molding mass, for instance. The low-pressure compression mass is applied using an injection molding process, for example. Place holders, for thicker dielectrics, for instance, may be reserved in the polymer mass in addition. However, they may also be enclosed as inserts when the at least one electronic component is encapsulated by the polymer mass.

In one example development, the insulating layer of the conductive foil includes at least one liquid crystal polymer. Because of the thermoplastic and partially crystalline properties of the liquid crystal polymer (LCP), it is possible to adapt the conductive foil to a desired expansion coefficient. The adaptation to the desired expansion coefficient is implemented based on the type, the proportion, arrangement and concentration of the crystalline component of the polymer.

When the electronic components are pressed to different depths into the insulating layer of the conductive foil, the pressing into the insulating layer of the conductive foil is preferably carried out in such a way that the plated-through holes, via which the electronic components are connected to the conductor track structure, have an aspect ratio that is greater than 1. It is especially preferred if the aspect ratio lies within a range from 1 to 3. An aspect ratio is the ratio of length to diameter of the bore.

The affixation of the at least one electronic component is preferably implemented by adhesive bonding. To this end, the conductive carrier foil preferably includes an adhesive layer. Preferably, the adhesive layer forms the insulating layer at the same time. The conductive carrier foil is a self-adhering, conductive carrier foil, for instance. The mounting may be implementing by heat and pressure processes. This is also, for example, a heat bonding process. As an alternative, it is naturally also possible to affix the at least one electronic component by adhesively bonding it to the insulating layer of the conductive foil with the aid of an electrically non-conductive adhesive agent. Such bonding adhesives are, for example, conventional polymer adhesives.

The used conductive carrier foil is a copper foil, for instance, as it is also known as RCC material from circuit board technology. Other suitable foils are LCP foils or FEP foils, for example. LCP foils are especially preferred since their expansion coefficient is adjustable as a result of the semi-crystalline and thermoplastic properties already mentioned above. In addition to copper, aluminum, nickel or nickel alloys, e.g., NiPd, NiAu, NiPdAu, for instance, are also suitable metals.

In one example embodiment, alignment marks are introduced in the conductive carrier foil prior to mounting the at least one electronic component on the conductive foil in step (a). The alignment marks are holes or blind holes, for example, having any desired cross-section. They may be introduced into the conductive carrier foil by etching, stamping or drilling, for instance. The alignment marks are made on the side of the conductive carrier foil that lies opposite the at least one electronic component. Because of the alignment marks, it is possible to determine the precise position of the at least one electronic component even after encasing the at least one electronic component in the polymer mass or after laminating the conductive carrier foil onto the circuit board substrate. This is necessary for the contacting of the at least one electronic component. As an alternative, for instance, components that are used to populate the conductive foil are also suitable as alignment marks. At the location where the components are situated, the conductive foil is preferably exposed by drilling or is x-rayed in order to detect the components. In addition, the alignment marks may naturally have any other form known to one skilled in the art.

Holes are preferably introduced at the positions where the at least one electronic component is to be electrically contacted with the conductive carrier foil. The holes are metal-coated, for instance, for the contacting of the conductive carrier foil with the at least one electronic component. The holes are introduced by laser-drilling, for example. The positions where the holes are introduced are determined with the aid of the alignment marks.

The metal-coating of the holes to establish contact between the electronic component and the conductive carrier foil is implemented in the manner known to one skilled in the art.

For example, the metal-coating may be implemented by currentless metal deposition. The currentless metal deposition is a conventional method used in the production of circuit boards. The metal-coating of the holes is preferably implemented using copper. However, aluminum, nickel and nickel-containing alloys such as NiPd, NiAu and NiPdAu are also suitable alternatives.

Additional circuit tracks may be applied by, for example, mounting additional layers including circuit tracks on the conductive carrier foil structured in (c). To this end, a dielectric, which covers the circuit tracks developed in step (c), is preferably applied first. This simultaneously insulates the circuit tracks so that no undesired electric contact takes place with the circuit tracks of the layer mounted subsequently. Additional circuit tracks are then affixed on the dielectric using methods known to one skilled in the art. The additional layers including the circuit tracks may alternatively also be produced by applying additional conductive foils on the first layer and subsequent structuring of the foil to develop circuit tracks.

In the example embodiment in which the conductive foil is spread open before the additional layers including circuit tracks are applied, it is possible to structure the circuit tracks of the additional layers by known processes, e.g., photolithographic or similar methods. Since the first layer is enlarged by spreading the circuit track structure, the process of producing the additional circuit track structures no longer requires the same precision as the process of producing the first circuit track structure. During the spreading process, the connection area of the first circuit track structure is routed to the outside. This is achieved by enlarging the structure during the etching operation, for instance.

When the circuit track structure of the first layer is spread open prior to applying the additional layers, it is preferred if the contacting on the landing surfaces of the electronic components is implemented at an offset. The advantage of the offset contacting is, for instance, that components having very small grid measurements are able to be drilled, and that a larger size may be selected for the bores of the upper layers.

Furthermore, in order to achieve a tighter assembly, it is possible to affix additional components on the electronic components using stack technology. This is generally done in such a way that the connection contacts of the electronic components point away from each other. The bonding of the additional electronic components on the components is able to be implemented with the aid of a die-attach film, for instance.

To dissipate heat generated while operating the electronic subassembly, it is preferred that the at least one electronic component is contacted by a metal core once the conductive carrier foil has been laminated onto the circuit board substrate in step (b), the contacting taking place on the side pointing away from the conductive carrier foil, so that the metal core is also integrated into the circuit board after lamination onto the circuit board substrate. During operation, the electronic component then releases heat to the metal core, via which it is then able to be dissipated to the outside. Furthermore, if the electronic components are encapsulated by the polymer mass, it is also possible for a metal core to be included in the polymer mass for the dissipation of heat. Preferably, the utilized metal is a metal having excellent thermal conductivity, such as copper. In one specific development, the metal core via which heat is able to be dissipated is integrated into the circuit board substrate.

The advantage of the method of the present invention is that the encasing of the at least one electronic component by the polymer mass, or the embedding of the electronic component in the circuit board substrate, provides a cost-effective encapsulation of passive and active electronic components. In addition, the electronic subassembly is very reliable because of the complete encapsulation of sensitive components. An additional advantage of the encapsulation is that it allows for a height compensation if components of different heights are used.

Furthermore, the method according to the present invention avoids risky mixed techniques in the production, such as soldering, adhesive bonding or wire bonding, for example. When the electronic subassembly is used in high-frequency technology, i.e., if the electronic component is a high-frequency component, then reproducible high-frequency transitions are achieved through the planar base structure obtained by the method according to the present invention.

Moreover, the method according to the present invention permits possibly required heat sinks to be integrated on power semiconductors. For instance, they may contact the electronic component on the side facing away from the conductive carrier foil. As an alternative, it is also possible to embed them in the polymer mass, for example, by which the at least one electronic component is enclosed.

Furthermore, cost-effective wiring and encapsulation are achievable by the method of the present invention through the use of processes on many subassemblies at the same time. Especially if the first layer is spread open before applying additional layers of circuit track structures, it is possible to process an entire large batch simultaneously.

BRIEF DESCRIPTION OF SEVERAL VIEWS OF THE DRAWING

FIG. 9.1 shows a schematic illustration of an offset contacting in a plan view.

FIG. 9.2 shows a schematic illustration of the offset contacting according to FIG. 9.1, in a sectional view.

DETAILED DESCRIPTION

Figure 1:
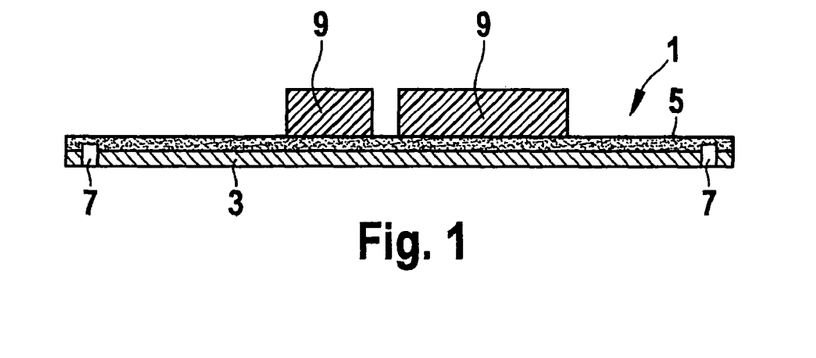
FIG. 1 shows a conductive foil having electronic components mounted thereon.

FIG. 1 shows a conductive foil with electronic components affixed thereon.

A conductive carrier foil 1 includes a conductive layer 3 and an insulating layer 5. Insulating layer 5 is preferably an adhesive layer or a thermoplast on which electronic components 9 are able to be mounted. Alignment marks 7 are introduced on the side of conductive carrier foil 1 on which conductive layer 3 is located. Alignment marks 7 may be introduced in conductive carrier foil 1 by etching, stamping or drilling, for instance. Furthermore, it is also possible that the alignment marks are components connected to conductive carrier foil 1, which are exposed by drilling or detected by x-ray microscopy. Any other form of alignment marks known to one skilled in the art is possible as well.

Conductive layer 3 preferably is a metal layer. Especially preferred as metal is copper. As an alternative, aluminum or nickel or nickel alloys are also suitable for the metal layer.

In a second step, after introduction of alignment marks 7, electronic components 9 are mounted on insulating layer 5. In addition to electronic components 9, it is also possible to mount mechanical components on insulating layer 5 of conductive carrier foil 1. Electronic components 9 or mechanical components mounted on insulating layer 5 of conductive carrier foil 1 are conventional components that are used in the construction of circuit boards. These are, for example, chips, processors, high-frequency components, SMD components, antenna subassemblies, heat sinks, MEMS or MOEMS.

The mounting of electronic components 9 or the mechanical components is preferably implemented by adhesive affixation on insulating layer 5. In the process, electronic components 9 are placed on insulating layer 5 of conductive carrier foil 1 in the way electronic components 9 are ultimately meant to be situated in the electric circuit. It is also possible to place heat sinks on top of individual or all electronic components 9 in order to ensure increased heat dissipation during operation of electronic components 9. The optionally providable heat sinks are placed on the side of electronic components 9 facing away from conductive carrier foil 1.

To achieve an optimum aspect ratio for future contacting of electronic components 9 with conductive layer 3 from which a circuit track structure is produced, it is preferred if electronic components 9 are pressed into insulating layer 5 to different depths. The press-in depth depends on the size of the pads with whose aid electronic components 9 are contacted. A component having large pads needs to be pressed in less deeply than an electronic component 9 having small pads. This is due to the fact that rougher holes can be drilled in large pads than in small pads. Small pads require finer bores. It is advantageous, especially in the case of high-frequency uses, if the aspect ratio of the bores lies in the range from 1 to 3. That means that the bores have a maximum depth that is three times the size of the diameter of the bore. The different press-in depths of electronic components 9 in insulating layer 5 is adjusted, for example, by the force at which electronic components 9 are pressed onto insulating layer 5, the temperature and the holding time at which electronic components 9 are adhesion-mounted. In addition to insulating layer 5, it is possible to use an additional adhesive agent by which electronic components 9 are mounted on insulating layer 5. Preferably, the additional adhesive is electrically insulating as well.

Figure 2:
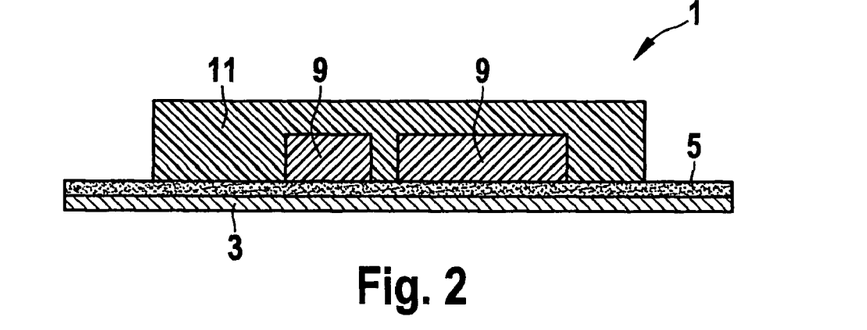
FIG. 2 shows a conductive foil having electronic components encapsulated by a polymer mass mounted thereon.

In order to achieve an encapsulation of sensitive electronic components 9, it is possible to encase them in a polymer mass 11. This is illustrated in FIG. 2. Polymer mass 11 is an epoxy low pressure moulding compound, for example. If required, place holders for thicker dielectrics, which are used for antennas or heat sinks, for instance, may be injection molded in polymer mass 11. The encasing by polymer mass 11 is implemented with the aid of an injection-pressing method, for example. As an alternative, it is also possible to produce the encapsulation by polymer mass 11 using a sol-called glop top process. For this purpose electronic components 9 are embedded in a liquid resin mass, such as an epoxy resin, for instance. The liquid resin mass is then cured.

The place holders may be developed as recesses or troughs, for instance.

In addition to the injection-pressing method, however, any other method known to one skilled in the art by which electronic components 9 are able to be embedded in polymer mass 11 may be utilized. Moreover, the encapsulation by polymer mass 11 has the advantage that it allows for a height compensation for components 9 having different thicknesses. This is advantageous for the subsequent lamination process. Furthermore, components may be pre-encapsulated on a removable foil and then mounted on carrier foil 1 once the foil has been peeled off.

After mounting electronic components 9 on conductive carrier foil 1 or—if electronic components 9 are to be embedded in polymer mass 11—after embedding electronic components 9 in polymer mass 11, conductive foil 1 is cut to size, preferably to the size of the circuit board.

Figure 3:
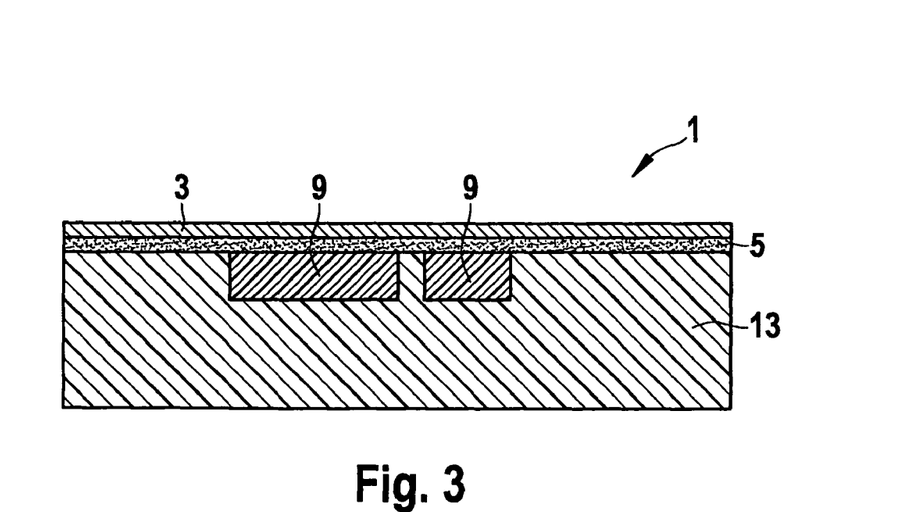
FIG. 3 shows a conductive foil having electronic components, the foil being laminated onto a circuit board substrate.

Following the cutting, conductive foil 1 with electronic components 9 mounted thereon and possibly additional components not shown here, is laminated on top of a circuit board substrate 13. This is illustrated in FIG. 3. For the variant shown here, conductive foil 1 with electronic components 9 has been laminated on top of circuit board substrate 13 without electronic components 9 having been encapsulated by polymer mass 11. However, according to the present invention, the development shown in FIG. 2, in which electronic components 9 are encased by polymer mass 11, is also laminated on top of circuit board substrate 13. The laminating is implemented according to methods known to one skilled in the art. According to the present invention, circuit board substrate 13 is laminated on conductive foil 1 in such a way that electronic components 9, or electronic components 9 encased by polymer mass 11, are enclosed by circuit board substrate 13. To this end, circuit board substrate 13 is laminated onto conductive foil 1 on the side on which electronic components 9 are mounted as well.

In general, for components 9 whose component thickness is greater than 0.1 mm, a glass fiber-reinforced cured circuit board material, which is predrilled at the locations of components 9, is first placed on top of the foil for this purpose. A prepreg and possibly a further cured circuit board material are placed on top of it. Pressure is then applied to this stack in a lamination process. The cured circuit board material is usually an epoxy resin reinforced by glass fiber. However, any other suitable material known to one skilled in the art may be used as well. An epoxy raisin is usually also used as prepreg. However, the curing has not yet been completed. By applying pressure and using an increased temperature, the prepreg cures completely and thereby combines with the cured circuit board material. The composite of prepreg and cured circuit board material forms circuit board substrate 13.

In order to avoid slippage or distortion of the electronic components during the laminating process, the laminating of circuit board substrate 13 is carried out in a specified narrow temperature range. To this end, the temperature for the lamination process is set to a range of ±5 K, for instance. The temperature for the laminating is lower than the melting temperature of the adhesive with whose aid electronic components 9 are mounted on conductive foil 1. This avoids sliding. As an alternative, it is preferred if the adhesive agent by which electronic components 9 are fixed in place on conductive foil 1 is already cured to such an extent that the components are no longer able to slide or distort. This is able to be realized by duromers, for instance, which no longer soften even at a higher temperature. Such duromers are employed when RCC foils, for instance, are used as conductive foil 1. No separate adhesive layer is provided in the case of LCP foils. However, the adhesive mounting takes place at a temperature that lies above the temperatures of all subsequent method steps.

After conductive foil 1 including electronic components 9, or including electronic components 9 possibly encased by polymer mass 11, has been laminated onto circuit board substrate 13, holes 17 are cut into carrier foil 1 at the connection points of electronic components 9, carrier foil 1 encompassing conductive layer 3 and insulating layer 5. The correct positioning of holes 17 may be determined by alignment marks 7 introduced at the outset. This makes it possible to produce holes 17 at precisely the positions where the electric connections of electronic components 9 are located.

Figure 5:
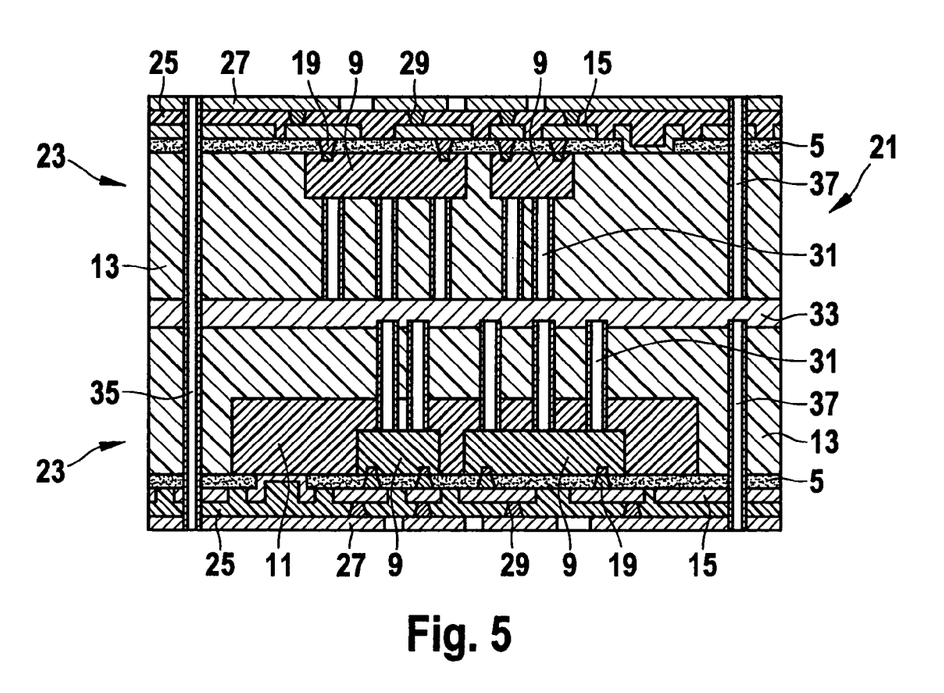
FIG. 5 shows an electronic subassembly according to the present invention.

At the same time as holes 17 are introduced for the contacting of electronic components 9 with conductive layer 3, or directly following it, cooling channels 31, as they are illustrated in FIG. 5, are usually drilled into circuit board substrate 13. A laser drilling method, for example, is used for this purpose. If holes 17 are also produced by a laser drilling method, it is preferred if a second laser is used for cooling channels 31. However, other holes 17 and cooling channels 31 may also be drilled using the same laser.

Figure 4:
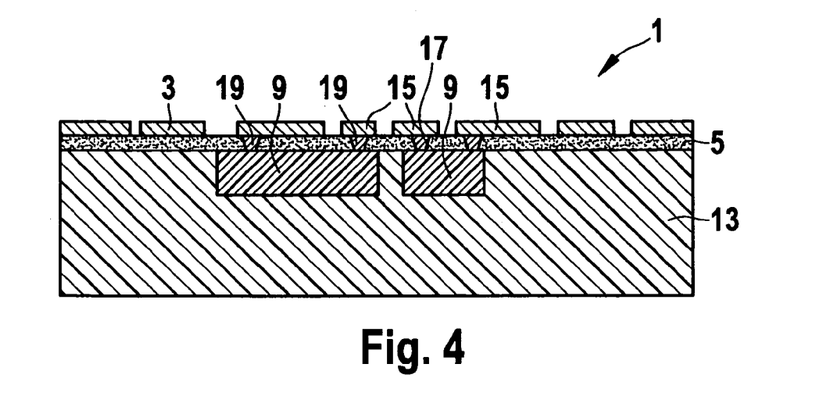
FIG. 4 shows the circuit board substrate from FIG. 3 having a developed circuit board structure and contacted electronic components.

Electronic components 9 are electrically contacted with conductive layer 3 by metal coating. This is illustrated in FIG. 4. Using methods known to one skilled in the art, such as currentless metal deposition, for example, metal 19 is deposited in holes 17 for the metal coating. This metal connects the connections of electronic components 9 with circuit track structure 15. An electric contact was produced. As a rule, metal 19 used for the metal coating is copper. As an alternative, aluminum, nickel or nickel alloys may be used as well. In general, a starting metallization of palladium is first deposited in currentless manner for the metal-coating. This is followed by a galvanic metal deposition. Metal 19 may assume the form of a sleeve or it may fill holes 17 completely.

After holes 17 have been introduced in conductive foil 1 for the contacting of electronic components 9, and after holes 17 have been metal-coated, conductive layer 3 is structured as illustrated in FIG. 4. The structuring is implemented by any method known to one skilled in the art. Suitable methods are, for example, etching methods, photoresist methods, laser drilling methods or laser ablation methods.

Structuring of the conductive layer produces the circuit track structures 15 required for the circuit board.

A planar top surface is achieved by embedding electronic components 9 in circuit board substrate 13. This permits simple processing of the surface.

However, it is of course also possible to first produce circuit track structure 15 out of conductive foil 1, and then to introduce and metal-coat the holes in conductive foil 1.

An electronic subassembly 21 is shown in FIG. 5. Electronic subassembly 21 includes two circuit boards 23, which are designed as illustrated in FIG. 4. A dielectric 25 is applied on circuit track structure 15 in order to mount an additional circuit track structure 27. Epoxy resins or FR4 materials, which are known from circuit board technology, are suitable as dielectric 25. The application of dielectric 25 is implemented using the conventional methods known to one skilled in the art. For example, it is possible to apply dielectric 25 by raking, painting, printing, laminating, curtain coating, film-coating, spray-coating or similar methods.

An additional circuit track structure 27 is applied on dielectric 25. It is possible to apply a conductive layer across the entire surface first and then to structure it.

Preferably, it is also possible to apply an additional conductive foil 1 on first circuit track structure 15, and to structure conductor track structure 27 out of the conductive layer of the second conductive foil. The same methods as for structuring conductive layer 3 into circuit track structure 15 are then preferably used for this purpose. After conductor track structure 27 has been produced, holes 29, through which contacting of circuit track structure 27 with circuit track structure 15 takes place via metal coating, may then be introduced in dielectric 25. Holes 29 may naturally also be introduced before circuit track structure 27 is produced.

For the production of a plurality of conductive layers, structured to form circuit tracks, it is especially preferred if dielectric 25 and then a conductive foil are laminated initially. Once dielectric 25 and the conductive foil have been laminated, holes are introduced first, which are then metal-coated in order to electrically connect the conductive foil and the layers lying underneath. Then a further circuit track structure 27 is worked out of the conductive foil.

In order to be able to produce further circuit track structure 27 with the aid of advantageous methods, it is preferred if insulating layer 5 and circuit track structure 15 are spread open prior to applying dielectric 25. This enlarges the circuit track structure. A less precise production method may be used for additional circuit track structures 27. Photolithographic methods, for example, are then also suitable as structuring methods. These are more advantageous methods, so that the electronic subassembly is able to be produced in a more advantageous manner.

In order to dissipate heat from electronic components 9, it is possible to introduce cooling channels 31 in circuit board substrate 13 on the side of electronic components 9 facing away from circuit track structures 15, 27. Cooling channels 31 are connectable to a metal core 33. Heat from electronic components 9 is dissipated via metal core 33 and cooling channels 31. Cooling channels 31 are usually connected to metal core 33 via rear-side metal-coating or by alternative connections, in which the inner walls of cooling channels 31 are coated with a metal layer. However, cooling channels 31 may also be completely filled with a metal.

Another option consists of providing heat sinks between metal core 33 and electronic components 9. Metal core 33 is also able to be designed in such a way that it makes direct contact with electronic components 9.

The connection of circuit boards 23 preferably is likewise implemented with the aid of a lamination process, as usual in manufacturing processes of circuit boards.

With the aid of a bore 35, which passes through both circuit boards 23, it is possible to connect circuit track structure 15 of the one circuit board 23 to circuit track structure 27 of second circuit board 23. For instance, the electric contact is realized by metal-coating the wall of bore 35. Using a bore 37, which ends on metal core 33, circuit track structure 15, 27 is able to be electrically contacted to metal core 33. This makes it possible, for instance, to realize a ground contact. For bore 37, as well, the electric contact is preferably implemented with the aid of metal coating. The metal-coating of bores 35, 37 is produced by currentless or galvanic metal deposition, for instance. As an alternative, however, it is also possible to route a wire through bores 35, 37, for example.

In the specific development shown in FIG. 5, electronic components 9 in one circuit board 23 are not encased by polymer mass 11, and in second circuit board 23, which is used for electric subassembly 21, electronic components 9 are encased by polymer mass 11.

In addition to the specific embodiment illustrated here, in which two circuit track structures 15, 27 are superposed in each case, it is of course also an option to provide more than two circuit track structures on one side. It is likewise possible to form a different number of circuit track structures 15, 27 on the upper side and the lower side of electronic subassembly 21.

Figure 6:
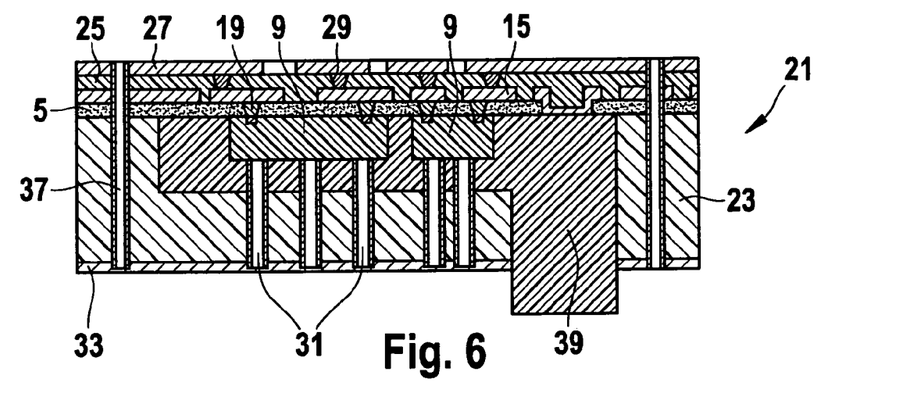
FIG. 6 shows an electronic subassembly according to the present invention, having a mechanical insert.

FIG. 6 shows an electronic subassembly designed according to the present invention and having a mechanical insert.

Electronic subassembly 21 shown in FIG. 6 differs from the electronic subassembly shown in FIG. 5 in that circuit board 23 is provided with electronic components 9 and circuit track structures 15, 27 on one side only. Furthermore, a mechanical insert 39 is formed within circuit board 23. Mechanical insert 39 is a flow channel, for instance. Such a channel is required, for example, if electronic subassembly 21 includes a flow sensor or if it is a flow sensor. However, mechanical insert 39 may also be any other mechanical insert required to operate electronic subassembly 21. Moreover, mechanical insert 39 may be, for instance, a housing part, installation part, e.g., a mechanical fixation, such as for snap or screw connections, a functional structure such as a gas supply, a channel, e.g., for the supply of radiation or media, or also a 3D-circuit board, e.g., an MID structure having mounted components.

Figure 7:
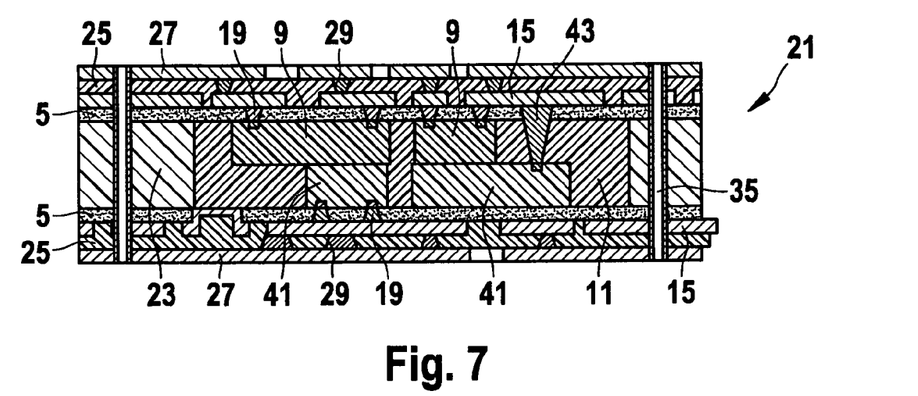
FIG. 7 shows an electronic subassembly according to the present invention, having components in two planes.

An electronic subassembly 21 in another specific development is shown in FIG. 7.

In the electronic subassembly 21 shown in FIG. 7, additional electronic components 41 have been mounted on electronic components 9. The mounting of electronic components 41 on electronic components 9 is implemented by adhesive bonding, for instance. Die-attach films, for example, are used for this purpose. The affixation is implemented by adhesive bonding. Electronic components 9, 41 are interconnected in such a way that the connection sides are pointing away from one another. Electronic components 9, 41 are then connected to circuit track structures 15, 27, which are situated on the top side or bottom side of electronic subassembly 21. Connections of electronic components 9, 41 are pointing to circuit track structures 15, 27. However, it is also possible for one electronic component 9, 41 to be connected to circuit track structure 15, 27 disposed on the side on which the respective other components 9, 41 are located. This requires a contacting 43 past an electronic component 9 to electronic component 41, through circuit board 23. Components 9, 41 may be encased in a polymer mass 11, as illustrated in FIG. 7. As an alternative, it is also possible to insert components 9, 41 directly into the circuit board substrate, without encasing them in polymer mass 11 beforehand.

Figure 8:
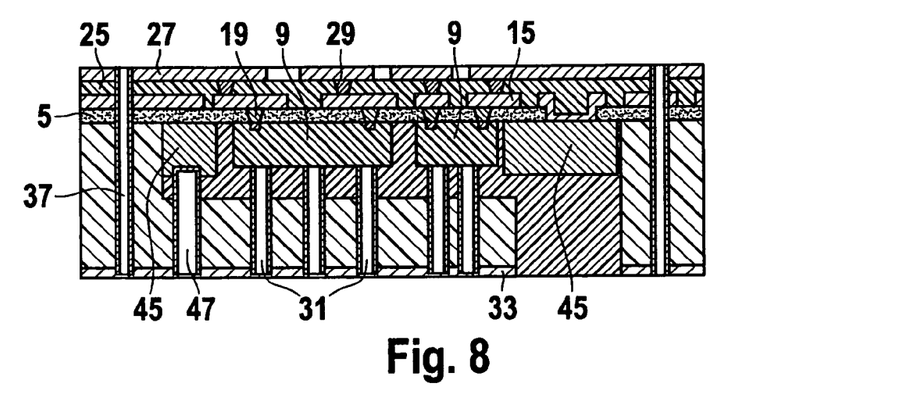
FIG. 8 shows an electronic subassembly according to the present invention having integrated metal cores.

An electronic subassembly 21 in yet another specific development is shown in FIG. 8.

The specific development shown in FIG. 8 differs from the specific embodiment shown in FIG. 6 in that for better heat distribution on the electronic component or for heat dissipation from the electronic component, additional metal cores 45 have been provided in the immediate vicinity of electronic components 9. Metal cores 45 are also enclosed by polymer mass 11. Metal cores 45 have been mounted on insulating foil 5 together with electronic components 9, for instance when populating conductive foil 1. The heat dissipation away from metal cores 45 takes place via heat shunts 47, for example. They are realized in the form of a bore hole with a metal coating on the surface, for instance. Heat shunts 47 may also be completely filled with metal or some other material having excellent thermal conductivity.

Heat shunts 47 connect metal core 45 to metal core 33, which is able to dissipate heat to the environment.

Figure 91:
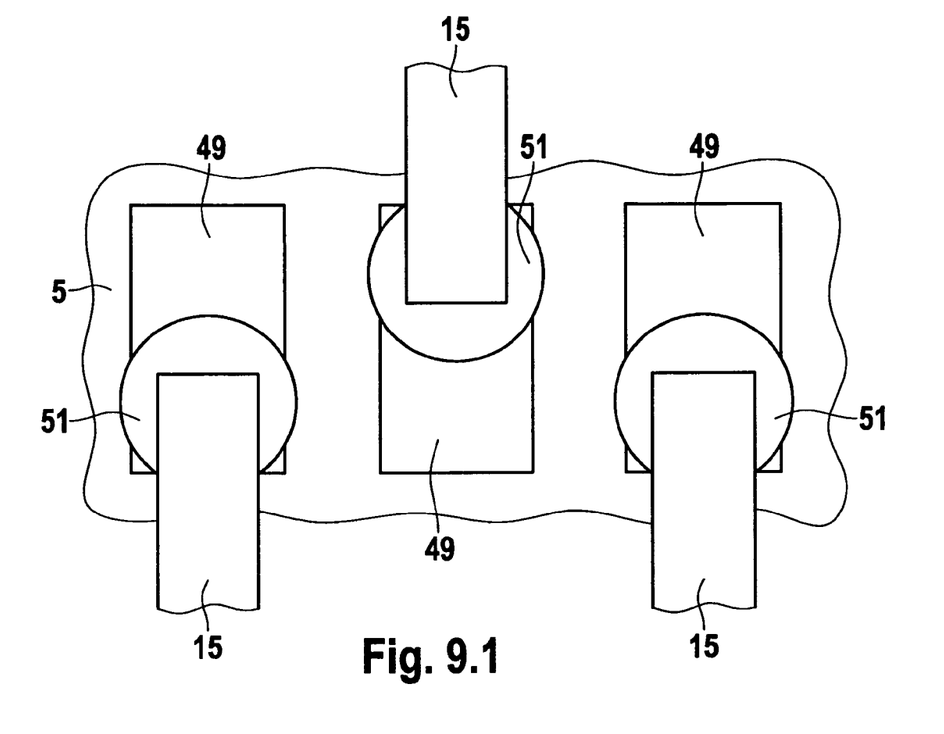
Figure 92:
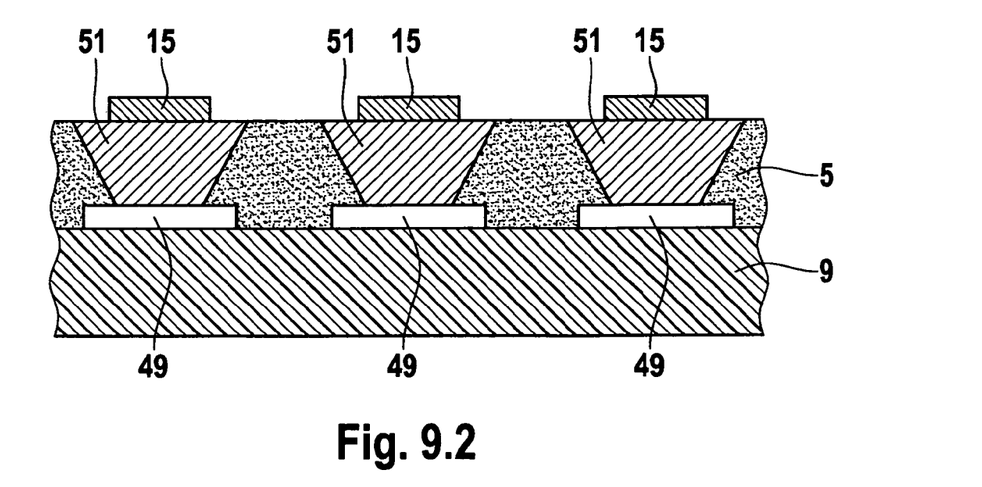

FIGS. 9.1 and 9.2 show an offset contacting by way of example, as it is advantageously implemented when insulating layer 5 and conductor track structure 15 are spread open prior to mounting additional circuit track structures. FIG. 9.1 shows a plan view, and FIG. 9.2 shows a sectional view. Electronic component 9, e.g., an IC, has rectangular contact areas 49. They are contacted via plated-through holes 51 through insulating layer 5. This makes it possible to connect electronic component 9 with circuit track structure 15.

For the spreading, the diameter of plated-through holes 51 increases from the electronic component to the top surface of insulating layer 5. The offset placement of plated-through holes 51 increases the center-to-center distance of plated-through holes 51 in comparison with a placement in rows. This facilitates the production, especially in the case of small center-to-center contact distances, e.g., distances of less than 150 µm, for instance.

The distances between the circuit tracks of circuit track structure 15 are able to be increased further by suitable routing of the lines in the next layer of the substrate, which further simplifies the methods for contacting.

Figure 10:
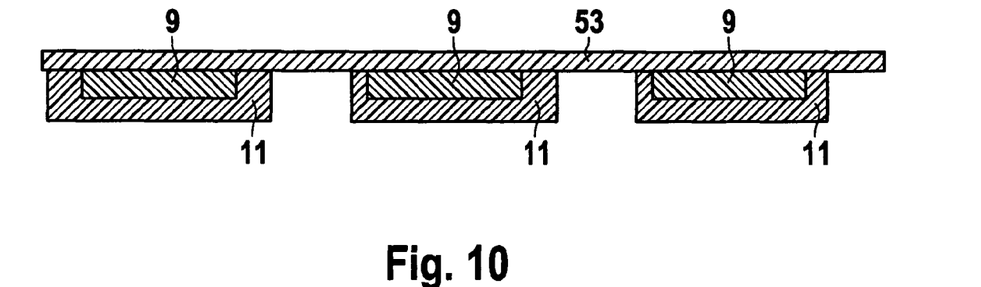
FIG. 10 shows a plurality of subassemblies on a conductive foil.

One advantage of the method according to the present invention is that this method also permits a complete roll-to-roll production in all machining operations. This makes it possible to produce circuit boards in one continuous line. It is also possible, for instance, to use flexible circuit board materials for this purpose. This is shown in FIG. 10 by way of example.

For the production of flexible circuit boards, electronic components 9, for instance, are mounted on a flexible circuit substrate 53. Flexible circuit substrate 53 usually includes an insulating layer and at least one circuit track structure, which are not shown here, however. To protect electronic component 9, it is possible to encase it in a polymer mass 11.

What is claimed is:

1. A method for producing an electronic subassembly including at least one electronic component affixed on a circuit board, as well as at least one circuit track structure by which the at least one electronic component is contacted, the method comprising:
   affixing the at least one electronic component on an insulating layer of a conductive foil, the active side of the at least one electronic component pointing in the direction of the conductive foil;
   laminating the conductive carrier foil having the affixed at least one electronic component onto a circuit board substrate, the at least one electronic component pointing in the direction of the circuit board substrate; and
   providing a circuit track structure by structuring the conductive foil and contacting the at least one electronic component;
   wherein the at least one electronic component is pressed into the insulating layer of the conductive foil to a selected depth to form passages such that plated-through holes connecting the at least one electronic component to the circuit track structure have an aspect ratio in the range of 1 to 3;
   wherein at least one of the following is satisfied:
   (i) the insulating layer of the conductive foil is made of a material having an expansion coefficient value between the expansion coefficient value of the circuit board substrate and the expansion coefficient value of the circuit track structure;
   (ii) the at least one electronic component requiring small passages in the insulating layer for the contacting with the circuit track structure are pressed deeper into the insulating layer than the at least one electronic component requiring larger passages in the insulating layer; and
   (iii) the circuit track structure provided by structuring the conductive foil is spread open prior to mounting an additional circuit track structure.

2. The method as recited in claim 1, wherein the at least one electronic component is enclosed by a polymer mass after affixation on the conductive foil.

3. The method as recited in claim 2, wherein the polymer mass has a liquid resin matrix, wherein the at least one electronic component is encapsulated by the liquid resin matrix, and wherein the liquid resin matrix is subsequently cured.

4. The method as recited in claim 2, wherein the insulating layer of the conductive foil includes at least one liquid crystal polymer.

5. The method as recited in claim 2, wherein the insulating layer is an adhesive layer, and wherein the at least one electronic component is adhesively mounted onto the adhesive layer.

6. The method as recited in claim 2, wherein alignment marks are introduced in the conductive foil prior to the affixation of the at least one electronic component on the conductive foil.

7. The method as recited in claim 2, wherein at least one additional layer including a circuit track structure is applied on the circuit track structure provided by structuring the conductive foil.

8. The method as recited in claim 2, wherein the at least one electronic component is contacted by a metal core on the side facing away from the circuit track structure.

9. The method as recited in claim 8, wherein the metal core is integrated into the circuit board substrate.

10. The method as recited in claim 2, wherein holes are introduced into the conductive foil at positions where the at least one electronic component is electrically contacted with the circuit track structure of the conductive foil.

11. The method as recited in claim 10, wherein the holes for contacting the circuit track structure with the at least one electronic component are metal-coated.

12. The method as recited in claim 11, wherein the circuit track structure provided by structuring the conductive foil is spread open prior to mounting an additional circuit track structure, following the metal-coating of the holes in the circuit track structure provided by structuring the conductive foil and the insulating layer.

13. The method as recited in claim 2, wherein the conductive foil has a conductive layer containing one of copper, aluminum, nickel or nickel-containing alloys.

14. The method as recited in claim 11, wherein the metal-coating of the holes is implemented using one of copper, aluminum, nickel or a nickel-containing alloy.

15. The method as recited in claim 2, wherein the affixation of the at least one electronic component is implemented by adhesion-mounting onto the insulating layer of the conductive foil using an electrically non-conductive adhesive agent.

* * * * *